United States Patent
Rao et al.

(10) Patent No.: US 7,791,976 B2
(45) Date of Patent: Sep. 7, 2010

(54) SYSTEMS AND METHODS FOR DYNAMIC POWER SAVINGS IN ELECTRONIC MEMORY OPERATION

(75) Inventors: Hari Rao, San Diego, CA (US); Dongkyu Park, San Diego, CA (US); Mohamed Hassan Abu-Rahma, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 139 days.

(21) Appl. No.: 12/108,608

(22) Filed: Apr. 24, 2008

(65) Prior Publication Data
US 2009/0268540 A1    Oct. 29, 2009

(51) Int. Cl.
G11C 5/14    (2006.01)
(52) U.S. Cl. .............. 365/227; 365/189.05; 365/230.06
(58) Field of Classification Search ............ 365/189.01, 365/189.05, 226, 227, 230.03, 230.08
See application file for complete search history.

(56) References Cited

U.S. PATENT DOCUMENTS

| | | | |
|---|---|---|---|
| 4,695,981 A | 9/1987 | Sikich et al. | |
| 5,023,837 A | 6/1991 | Schreck et al. | |
| 5,128,897 A * | 7/1992 | McClure | 365/230.06 |
| 5,222,047 A | 6/1993 | Matsuda et al. | |
| 5,424,997 A | 6/1995 | Rapp | |
| 6,005,410 A * | 12/1999 | Laramie | 326/39 |
| 6,023,428 A | 2/2000 | Tran | |
| 6,421,294 B2 * | 7/2002 | Hidaka | 365/230.03 |
| 6,594,191 B2 | 7/2003 | Lammers et al. | |
| 6,614,710 B2 * | 9/2003 | Song et al. | 365/230.03 |
| 6,664,807 B1 * | 12/2003 | Crotty et al. | 326/40 |
| 7,280,401 B2 * | 10/2007 | Di Gregorio | 365/185.17 |
| 7,388,774 B1 * | 6/2008 | Kim | 365/154 |
| 2009/0160849 A1 * | 6/2009 | Kiya et al. | 345/214 |

FOREIGN PATENT DOCUMENTS

EP    0478251    4/1992

OTHER PUBLICATIONS

International Search Report-PCT/US2009/039913, International Search Authority-European Patent Office Jun. 30, 2009.
Written Opinion-PCT/US2009/039913, International Search Authority-European Patent Office Jun. 30, 2009.

* cited by examiner

*Primary Examiner*—Gene N. Auduong
(74) *Attorney, Agent, or Firm*—Nicholas J. Pauley; Sam Talpalatsky; Peter M. Kamarchik

(57) ABSTRACT

Power reduction is accomplished in an electronic memory by segmenting portions of the memory and only enabling certain memory portions depending upon where the memory is to be accessed. In one embodiment, the bit lines are segmented using latch repeaters to control address selection with respect to segments beyond a first segment. The latch repeaters are, in one embodiment, allowed to remain in their operated/non-operated state at the completion of a memory read/write cycle. This then avoids successive enabling pulses when the same segment is accessed on successive cycles.

15 Claims, 4 Drawing Sheets

SYSTEMS AND METHODS FOR DYNAMIC POWER SAVINGS IN ELECTRONIC MEMORY OPERATION

TECHNICAL FIELD

This disclosure relates to electronic memory operation and more specifically to systems and methods for reducing power consumption in memory operation.

BACKGROUND

Power consumption is a concern in electronic memory operations. Power consumption falls into two categories, namely, stand-by power and dynamic power. In the stand-by or quiescent mode, the memory uses the least power because neither read operations nor write operations are occurring. Dynamic power consumption occurs during switching when memory is accessed for reads and/or writes.

Memory power consumption can be reduced by limiting the switching frequency and/or reducing the line capacitance because:

$$P = CV^2 fA$$

where P=dynamic power; C is line capacitance; V is the voltage applied to the line operated; f is the frequency of memory access; and A is the activity factor, i.e., the number of switches as a system cycles through reads and writes.

Often, memory power consumption is managed by dividing the memory into banks and then only enabling one bank at a time. One reason for creating banks is to reduce the amount of capacitance switched, and reduce switching activity which in turn reduces dynamic power. Frequency normally is not very controllable because it is desirable to operate the memory at high frequencies. Reducing voltage of operation is a very powerful technique to reduce dynamic power because a "cubic" effect results, with a concomitant decrease in frequency. Reducing voltage, however, impacts performance. Limiting the swing of a signal reduces dynamic power too, but such design are complex. Reducing the activity factor (switching events per cycle) is another effective technique to reduce dynamic power and is tied to clock gating, logic optimization, and circuit design techniques (banking being a good example). In addition to all this, proper shielding of signals (temporal, logical and physical) lead to dynamic power savings, especially in wide bus structures. The present invention goes beyond all these techniques.

BRIEF SUMMARY

Power reduction is accomplished in an electronic memory by segmenting bit lines and only enabling certain bitline segments depending upon where the memory is to be accessed. In one embodiment, bit lines are segmented with latch repeaters to control address selection with respect to segments beyond a first segment. The latch repeaters are, in one embodiment, allowed to remain in their operated/non-operated state at the completion of a memory read/write cycle to hold the state of their segment. This then avoids successive enabling pulses when the same segment is accessed on successive cycles.

In one embodiment there is disclosed a memory having at least one segmented bit line for data access to the memory such that the bit line has segments driven by a latch repeater. In one embodiment, an enabled/disabled state of the latch repeater is controlled by certain bits of a memory address.

In one embodiment, a memory operation is arranged for power reduction such that certain sectors are segmented so that less than all of said memory is polled for certain memory accesses. During any memory pooling cycle it is possible, depending upon the address being accessed for only the necessary memory segments to be enabled.

The foregoing has outlined rather broadly the features and technical advantages of the present disclosure in order that the detailed description that follows may be better understood. Additional features and advantages will be described hereinafter which form the subject of the claims. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the spirit and scope of the invention as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present disclosure, reference is now made to the following descriptions taken in conjunction with the accompanying drawings.

DETAILED DESCRIPTION

Figure 1:
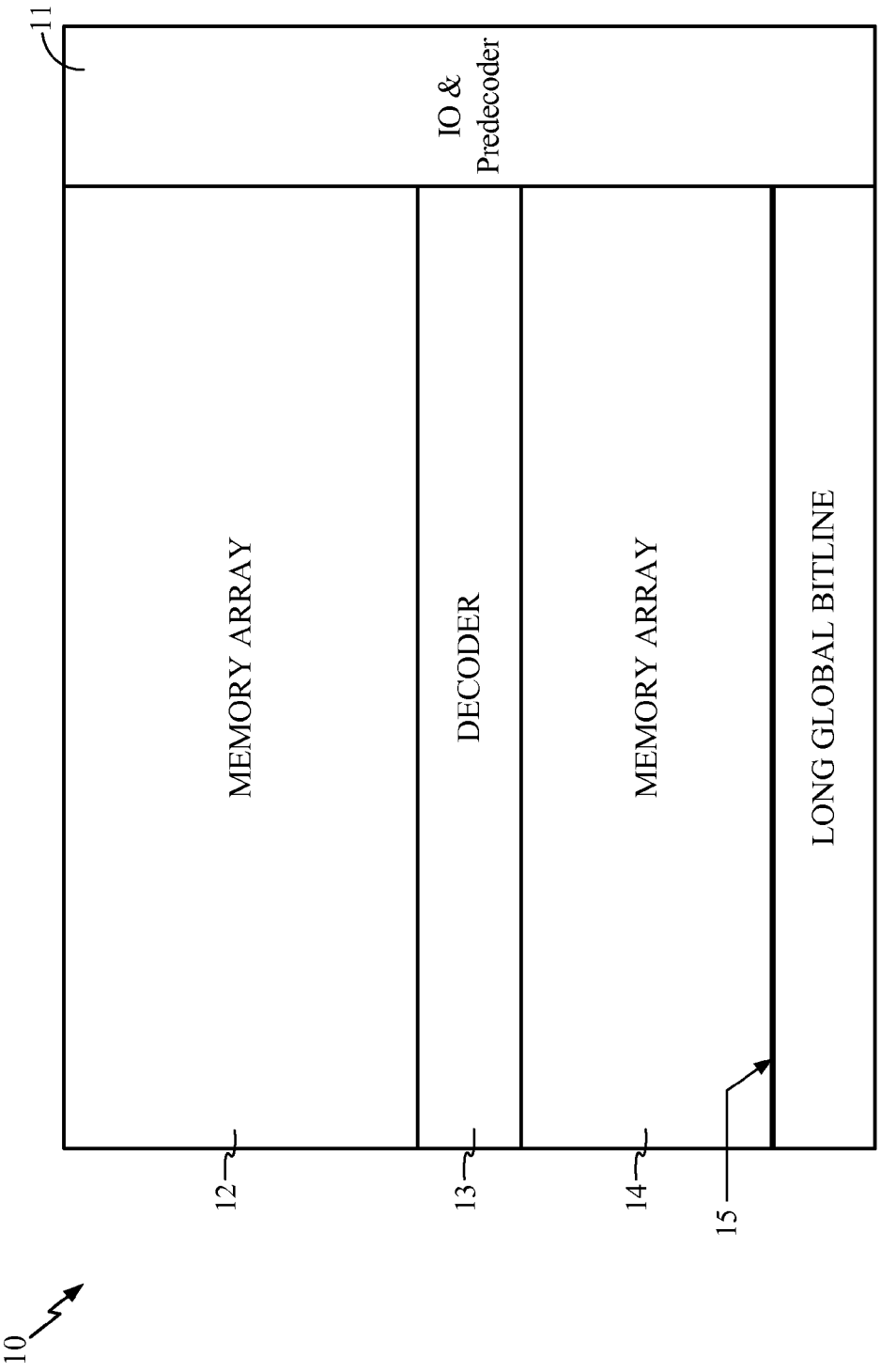
FIG. 1 is a block diagram illustrating a prior art generic memory.

FIG. 1 illustrates a prior art generic memory 10. This memory can be, for example, a SRAM, DRAM, MRAM, or other memory type. The memory 10 is typically constructed using a pre-decoder, such as the pre-decoder 11, and a decoder, such as the decoder 13. Memory arrays 12 and 14 are arrays comprising memory cells. The memory arrays 12, 14 consist of a number of global bit lines (15 being an example), which may be for reading and/or writing.

The memory consumes dynamic power in accordance with the size (length of the bit line) and power of the memory, as discussed above. Capacitance C of the bit line is determined mainly by fabricating technology and is approximately 0.25 femto farads per micron. Thus, a 300 micron bit line would have 75 femto farads of capacitance associated therewith. Accordingly, 75 fF of capacitance would be the minimum capacitance resulting from switching. As will be discussed, reducing power consumption can be accomplished by selectively varying the number of memory elements that are activated for a given memory access.

Figure 2:
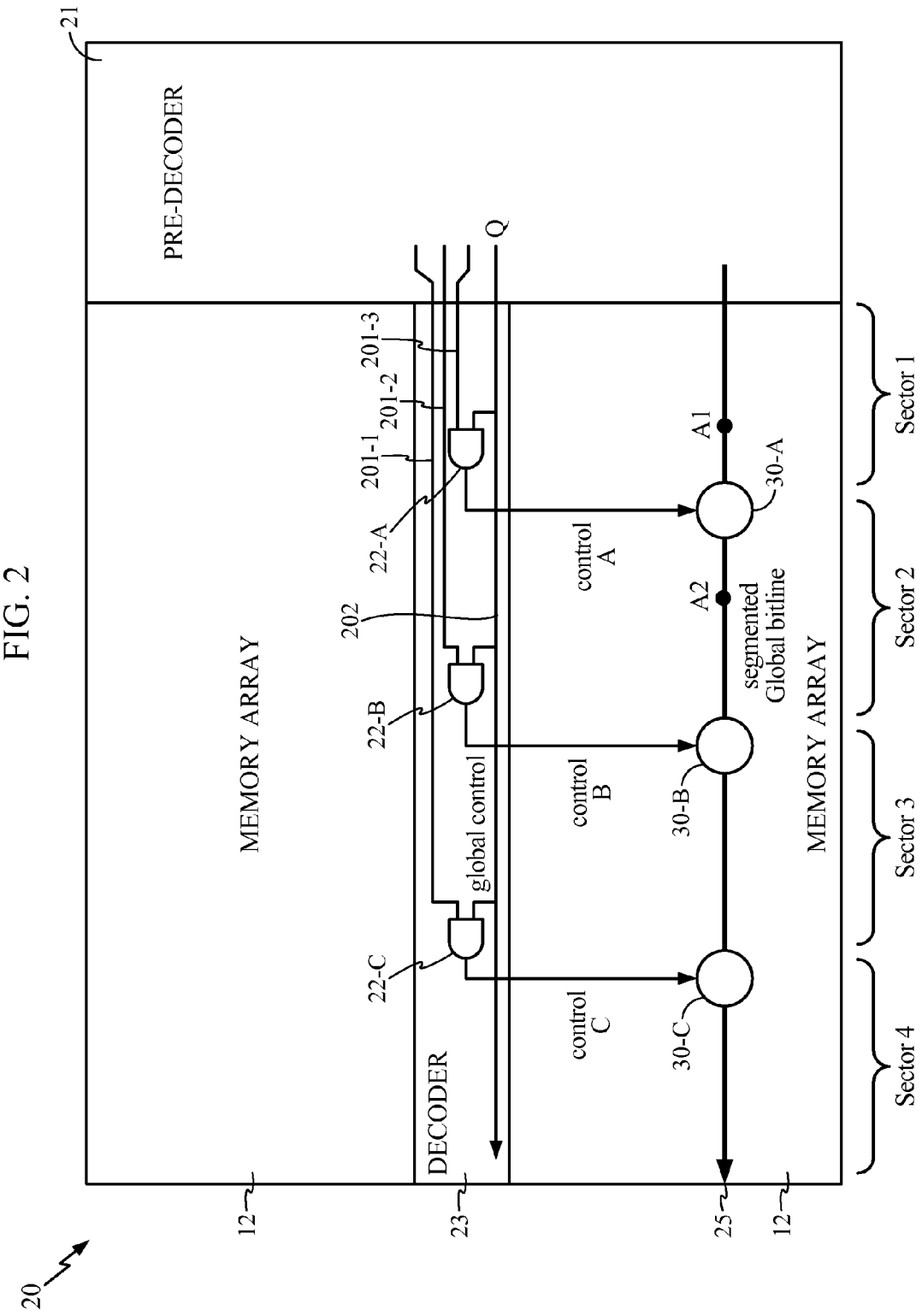
FIG. 2 is a block diagram illustrating segmented bit lines using at least one latch repeater.

FIG. 2 shows one embodiment of the disclosure using at least one latch repeater 30-A, 30-B, 30-C within a memory 20. The latch repeaters 30-A, 30-B, 30-C may be used to break a global bit line into a segmented bit line 25, thereby allowing the active length of bit line, and hence the capacitance, to be effectively reduced for some memeory cycles. The reduction in capacitance results in an overall reduction in memory power consumption.

A latch repeater decoder 23 controls which latch repeater(s) 30-A, 30-B, 30-C is activated at any given time depending upon what memory array element is to be accessed. Latch decoder drivers 22-A, 22-B and 22-C are provided within the latch repeater decoder 23. The latch decoder drivers 22-A, 22-B and 22-C latch repeaters 30-A, 30-B, 30-C to be on at a given time. The decoder drivers 22-A, 22-B, 22-C may enable only one latch repeater or multiple latch repeaters 30A, 30-B, 30-C at any time.

In the embodiment shown, the memory array and global bit line are divided into four sectors, and the bit line segments are separated by three latch repeaters 30-A, 30-B and 30-C. The bit line segment for sector 1 in this embodiment is always on and thus a latch repeater is not necessary within the segmented bit line 25 for sector 1. In order to access a memory element in sector 2, latch repeater 30-A must be activated. Likewise, latch repeater 30-B controls memory accesses to sector 3 and latch repeater 30-C controls memory accesses to sector 4.

Although FIG. 2 shows four sectors, of course, the memory can be divided into any number of sectors depending on the needs of the user. A reduction in bit line capacitance may be achieved using this sectored approach. For example, if access is to sector 1, then decoder driver (e.g., 22-A) is cut off, and thus only capacitance of the bit line up to the latch repeater 30-A results. If memory access to sector 2 is desired, then decoder driver 22-A would activate latch repeater 30-A and the line capacitance would increase. Access to sectors 3 and 4 would cause the capacitance to increase even further, when decoder driver 22-B and/or 22-C activate latch repeaters 30-B, 30-C for access to sectors 3 or 4, respectively.

Note that although FIG. 2 shows only one segmented bit line 25, for a 64 bit I/O memory there would be sets of 64 sets of bit lines. For multi port memories there would be one set of resources (decoder drive and latch repeater) for each port. A single port memory would have one set of segmented bit lines 25 for read and one set of segmented bit lines 25 for write.

Decoder drivers 22-A, 22-B, 22-C, and latch repeaters 30-A, 30-B, and 30-C will introduce delay in access times and consume power and thus could affect performance of the memory. However, performance is improved overall because, as noted above, statistics dictate that most accesses will be in the middle of the memory. Moreover, each latch repeater 30-A, 30-B, 30-C that is introduced reduces delay to the far end of the bit line because of the shorter length of the bit lines. Delay of a line is proportional to R*C. R and C are both inversely proportional to the length of the line. Thus, delay is inversely proportional to a square of the length of the line. When a line is split in half, its delay actually is cut into a fourth for this reason. Hence speed is enhanced by the use of latch repeaters 30-A.

Moreover, latch repeaters 30-A, 30-B and 30-C enhance the slope of signals input to gates, thereby reducing short circuits The input slope on the gate determines how long the device stays in a short circuit regime with both pull-up and pull-down transistors being on at the same time. Typically, the short circuit power accounts for 10-15% of the overall dynamic power. But if the input slope is really poor, the short-circuit power can be the dominant component. Breaking a line into segments and adding repeaters generally improves the input slope of each section.

One penalty for adding gates and repeaters is the need for increased space on the substrate. However, as technology advances from 45 nanometer to 32 nanometer, and still lower, additional space becomes available without increasing the area.

Decoder driver control based on memory addressing will now be discussed. In operation, each memory requires a certain number of address bits each time the memory is accessed. For example, assume an 8-bit address structure. Such a structure would have bits $a_0$ to $a_7$ which allow for access to 256 memory locations. Bit $a_7$ is the most significant bit (MSB) of the address. If the bit $a_7$ is zero then the access will be in sectors 1 or 2, and if bit $a_7$ is a 1 then the access is in sectors 3 or 4. Thus, if the MSB is a 1, a signal will be sent over leads 201-2, 201-3 to possibly active latch repeaters 30-A and 30-B. Whether latch repeater is actually activated, may depend on a qualifier signal sent over lead Q, as explained below.

Addresses typically come in early in the read or write cycle (before a rise in the clock edge) thus, the system pre-decoder 21 "knows" ahead of time which sectors will be accessed. Using this knowledge, if bit $a_7$ is a 1, the pre-decoder 21 can prepare to enable decoder drivers 22-A and 22-B (and their associated latch repeaters 30-A, 30-B) while the enabling of decoder drive 22-C (and its associated latch repeater 30-C) is yet to be determined. Alternatively, if the bit $a_7$ is zero only decoder driver 22A and its associated latch repeater 30-C— will possibly be enabled, with its enablement status to be determined based on analysis of the next most significant bit $a_6$.

By using bit $a_6$, the pre-decoder 21 can resolve the status of decoder drivers 22-A and 22-C and associated latch repeaters 30-A and 30-C. The value of bit $a_6$ determines whether the target memory access is to be in the upper or lower sector of the sectors selected by bit $a_7$. Thus, assuming bit $a_7$ is a 1 and bit $a_6$ is also a 1, then decoder driver 22-C and associated latch repeater 30-C are enabled via a signal over lead 201-1 because the memory access will be in sector 4. Similarly, if bit $a_7$ is a zero and bit $a_6$ is also a zero, then no decoder drives or latch repeaters are enabled because the target memory access will be in sector 1.

In one embodiment decoder drivers 22-A, 22-B, and 22-C are controlled, only in part, by signals on the leads 201-1, 201-2, 201-3, respectively, from the pre-decoder 21. To avoid unnecessary switching, qualifiers, such as read or write enable signals, can be used via lead Q from pre-decoder 21, in addition to the address bit related signals for enabling the various sectors. In this embodiment, decoder drivers 22-A, 22-B and 22-C can be AND gates. For example, if a write enable signal and an address bit signal are both received, decoder driver 22-A and latch repeater 30-A will be enabled. If the qualifier is not used, the decoder drivers 22-A, 22-B and 22-C could be inverters rather than AND gates. Also, note that any one of a number of memory access arrangements can be used for controlling the decoder drivers 22-A, 22-B and 22-C, including sending the information directly from another location as to which sector to select.

Figure 3:
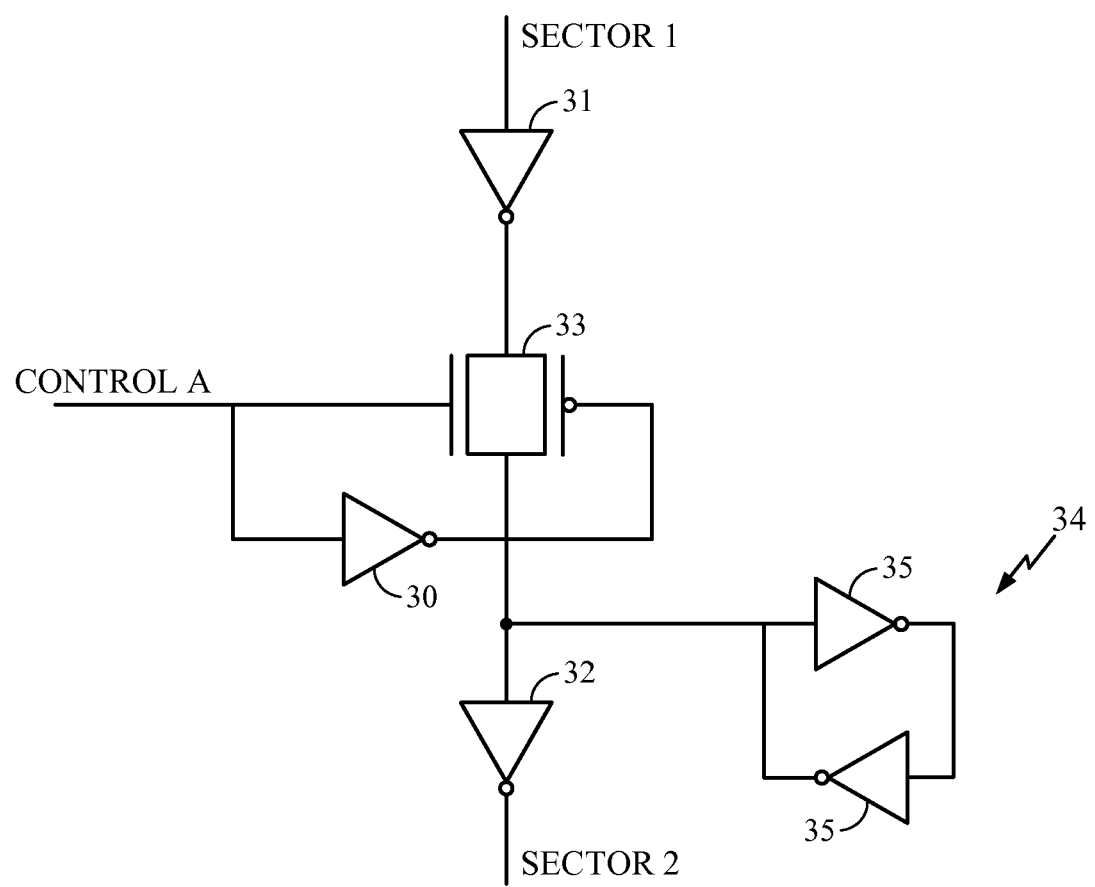
FIG. 3 is a circuit diagram showing one embodiment of a latch repeater used in the embodiment of FIG. 2.

FIG. 3 shows one embodiment of a latch repeater 30-A used in the embodiment of FIG. 2. The latch repeater 30-A is provided between points A1 and A2 (FIG. 2) of the segmented bit line 25. As shown, repeater 30-A comprises two inverters 31, 32 in series. Also shown is a latch 34 (including the two inverters 35) which opens or closes depending upon a switch, such as a pass gate 33. The pass gate 33 opens and closes in response to a signal on control line control A received from the decoder driver 22-A for sector 2. Note that the structure 30-A is shown by way of example only as other structures could be used to perform the functions described herein.

In operation, assuming $a_7$ is 1 (and a qualifier signal has been asserted) the latch repeater 30-A should be turned on. Thus, pass gate 33 receives a 1 signal from control line control A. In response, the N channel of pass gate 33 goes to 1 and the P channel goes to 0, turning the latch repeater on. With the latch repeater on, data on the bit line segment of sector 1 flows to the bit line segment for sector 2 and also updates the latch 34 with that data.

As a result of the latch 34 holding a data value, the latch 34 then controls the bit line value on the segment beyond the latch repeater 30-A, in this case the bit lines segment of sector 2. Once set, the data remains in the same state until actively changed by re-opening of the pass gate 33. Consequently, the bit line segment of sector 2 maintains the latched value, i.e., the bit line segment of sector 2 is driven by the latch repeater 30-A. If the next data value being input in sector 2 is the same as the previous data, the bit line segment of sector 2 need not discharge because the sector 2 bit line already is driven with the latched value. Thus, the structure being discussed has a history effect such that if all of the latch repeaters 30-A, 30-B, and 30-C are open, and 1's are to appear on all of the bit line segments for the next operation cycle, none of the bit line segments will again be discharged.

Some memory applications could be adapted to take advantage of the structure of this memory in that it might be possible to store data in accordance with its anticipated frequency of access. Accordingly, by storing data having a high access frequency in the upper half of the memory and storing data with a lower anticipated access frequency in the lower half, a greater power savings could be achieved than would occur with random data storage.

Note that while the discussion has centered around bit lines, the concepts discussed herein could be applied to word lines and to word lines operating in conjunction with bit lines. In such an arrangement, the word lines would be segmented by segment controllers. The segment controllers operate from separate controls coming to them outside of the address field thereby limiting operation of the memory only to the portion being accessed at a particular time.

Figure 4:
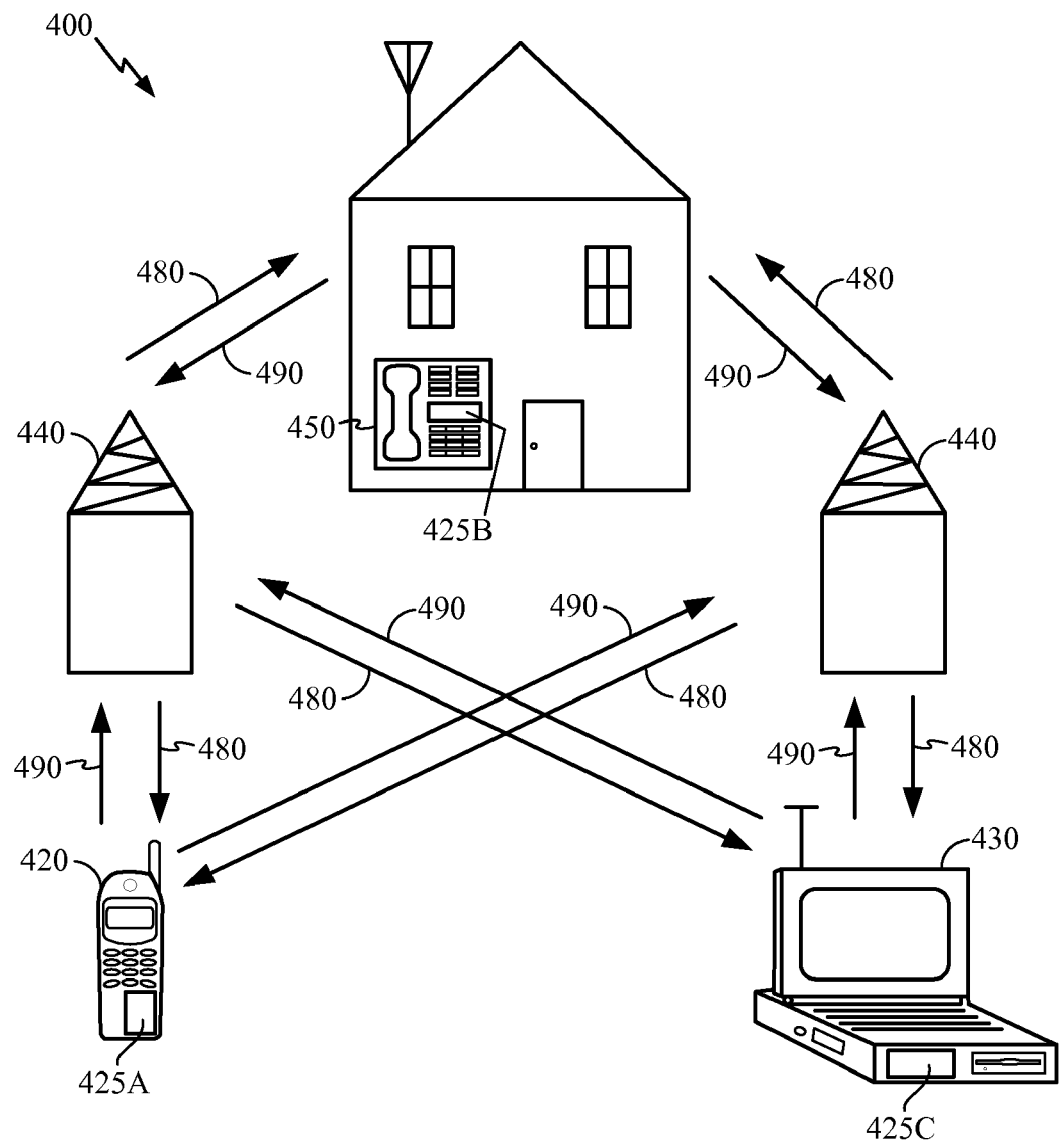
FIG. 4 is a block diagram showing an exemplary wireless communication system in which an embodiment of the invention may be advantageously employed.

FIG. 4 shows an exemplary wireless communication system 400 in which an embodiment of the invention may be advantageously employed. For purposes of illustration, FIG. 4 shows three remote units 420, 430, and 450 and two base stations 440. It will be recognized that typical wireless communication systems may have many more remote units and base stations. Remote units 420, 430, and 450 include improved full-swing memory arrays 425A, 425B, and 425C, respectively, which are embodiments of the invention as discussed further below. FIG. 4 shows forward link signals 480 from the base stations 440 and the remote units 420, 430, and 450 and reverse link signals 490 from the remote units 420, 430, and 450 to base stations 440.

In FIG. 4, remote unit 420 is shown as a mobile telephone, remote unit 430 is shown as a portable computer, and remote unit 450 is shown as a fixed location remote unit in a wireless local loop system. For example, the remote units may be cell phones, hand-held personal communication systems (PCS) units, portable data units such as personal data assistants, or fixed location data units such as meter reading equipment. Although FIG. 4 illustrates remote units according to the teachings of the invention, the invention is not limited to these exemplary illustrated units. The invention may be suitably employed in any device which includes a full-swing memory array.

Although specific circuitry has been set forth, it will be appreciated by those skilled in the art that not all of the disclosed circuitry is required to practice the invention. Moreover, certain well known circuits have not been described, to maintain focus on the invention. Similarly, although the description refers to logical "0" and logical "1" in certain locations, one skilled in the art appreciates that the logical values can be switched, with the remainder of the circuit adjusted accordingly, without affecting operation of the present invention.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A memory comprising:
    a serially segmented bit line for data access to said memory; and
    a latch repeater controlling bit line segments, the latch repeater being controlled by bits of a memory address and qualifiers selected from the list of: read enable signals, and write enable signals.

2. The memory of claim 1 further comprising:
    a latch for maintaining a state of said latch repeater across multiple accesses.

3. A method of electronic memory power reduction, said method comprising:
    selecting a segment of a bit line based upon address bits of a memory access; and
    updating at least one latch repeater on said bit line to substantially simultaneously enable a plurality of serial bit line segments, including the selected bit line segment.

4. The method of claim 3 further comprising:
    holding an updated value of said at least one latch repeater across multiple accesses.

5. The method of claim 3 further comprising:
    delaying said selecting based upon certain qualifiers in addition to said address bits.

6. The method of claim 3 further comprising:
    controlling said at least one latch repeater at least in part based on a value of a most significant bit of the address bits.

7. A method of electronic memory power reduction, the method comprising:
    selecting a segment of a word line based upon address bits of a memory address; and
    updating at least one latch repeater on said word line to substantially simultaneously enable a plurality of serial word line segments including the selected word line segment.

8. The method of claim 7, further comprising:
controlling said at least one latch repeater at least in part based on a value of a most significant bit of the address bits.

9. A memory comprising:
a plurality of memory arrays, said memory arrays adapted to store data;
a plurality of serially segmented bits lines at least one bit line for controlling access to sectors of said memory arrays; and
at least one latch repeater located in each serial segmented bit line, the latch repeater comprising a latch operable for holding a state of the latch repeater across memory cycles.

10. The memory of claim 9 further comprising:
a gate for enabling said latch repeater, said gate responsive to certain bits of an accessing address received by said memory.

11. The memory of claim 10 further comprising:
control circuitry for establishing signals for control of said gate, said control circuitry operating, at least in part, from values contained in at least one bit position of the address received by said memory, said address corresponding to a target sector.

12. The memory of claim 11 wherein said control circuitry is further operable to provide qualifiers to further control an enabling of said gate.

13. The memory of claim 10 further comprising:
circuitry for enabling said latch repeater to remain in an enabled state for greater than one memory access cycle.

14. The memory of claim 9 wherein said latch repeater comprises:
a pair of gates separated by a transmission switch, said transmission switch operable for enabling data from a first one of said gate pair to pass through a second one of said gate pair when said latch repeater is enabled.

15. The memory of claim 9 further comprising:
at least one latch repeater for separating serial word line segments.

* * * * *